United States Patent [19]
Hamerton-Kelly

[11] Patent Number: 5,675,472
[45] Date of Patent: Oct. 7, 1997

[54] QUICK-CHANGE, BLIND-MATE LOGIC MODULE

[75] Inventor: Paul R. Hamerton-Kelly, Palo Alto, Calif.

[73] Assignee: Apple Computer, Inc., Cupertino, Calif.

[21] Appl. No.: 577,714

[22] Filed: Dec. 22, 1995

[51] Int. Cl.⁶ .................................. G06F 1/16; H05K 7/02
[52] U.S. Cl. ........................ 361/684; 361/683; 361/752
[58] Field of Search ................................ 361/683–686, 361/724–727, 728, 733, 752, 816, 818, 825; 364/708; G06F 1/16

[56] References Cited

U.S. PATENT DOCUMENTS

| | | | |
|---|---|---|---|
| 4,179,724 | 12/1979 | Bonhomme | 361/727 |
| 4,916,578 | 4/1990 | Mast | 361/818 |
| 5,045,973 | 9/1991 | Saarela et al. | 361/818 |
| 5,126,954 | 6/1992 | Morita | 361/683 |
| 5,140,346 | 8/1992 | Goto et al. | 361/727 |
| 5,236,259 | 8/1993 | Ryan et al. | 312/244 |
| 5,256,833 | 10/1993 | Schwenk | 361/818 |
| 5,396,400 | 3/1995 | Register et al. | 361/686 |
| 5,460,441 | 10/1995 | Hastings et al. | 361/727 |

*Primary Examiner*—Leo P. Picard
*Assistant Examiner*—Lynn D. Feild
*Attorney, Agent, or Firm*—Blakely, Sokoloff, Taylor & Zafman

[57] ABSTRACT

A logic module comprising a panel slidably and detachably coupled to a portion of a module housing, and a logic component detachably coupled to the panel is disclosed. The entire contents of the logic components of the logic module can be quickly and easily removed from or inserted into the module housing without disconnecting cables, connectors, plugs or cards by slidably removing or inserting the logic module into the module housing. Thus, the logic components within the logic module are quickly and easily accessible for repair, replacement, or upgrading. Further, the logic module provides simple, direct access to the logic components without the struggle to remove cables, cards, screws, or housings. In addition, the electronic signals between the logic module and the module housing are consolidated at a single location and are mated by a pivoting or floating mezzanine printed circuit board attached to the module housing. The floating mezzanine printed circuit board eliminates visual alignment of the logic module to the mezzanine printed circuit board, yielding blind-mating or contacts that align themselves. Electrical power from the logic module to the logic components is also consolidated at a single location and is mated by a pivoting or floating power connector attached to the module housing. The floating power connector eliminates visual alignment of the logic module to the power connector, yielding blind-mating functionality or contacts that align themselves.

15 Claims, 4 Drawing Sheets

QUICK-CHANGE, BLIND-MATE LOGIC MODULE

FIELD OF THE INVENTION

The invention relates generally to logic modules and more particularly to the accessibility of the components of such devices.

BACKGROUND OF THE INVENTION

A logic module is a module capable of receiving, processing and presenting information. Examples of logic modules include the logic components or the "hardware" of stand alone computers, servers, or controllers and an Input/Output (I/O) panel with I/O connections. The logic components or hardware of the system receive information from and process and present information through I/O connections in an I/O panel as well as through other components connected to the module housing, e.g., data drives. The logic components or hardware send and present low-powered electronic signals, typically digital signals. The signals might correspond to data, process parameters, or other directives.

Central to the logic component or the hardware is the base board or motherboard. Attached to the motherboard of a logic module is the microprocessor, a semiconductor central processing unit ("CPU"). In addition to the microprocessor, the motherboard generally includes other printed circuit boards including, where appropriate, co-processors for peripheral components like monitors and sound, drives (e.g., floppy, CD-ROM, tape), memory chips, power supplies, etc. These peripheral components generally use cables running to the motherboard to establish communication or instead are connected through card-edge connectors or busses to the motherboard but use cables to establish electronic communication with the peripheral components.

In general, the motherboard is attached directly to the chassis of a logic module. To remove the motherboard from the housing/chassis requires removal or stripping of the chassis and the I/O panel. Removal of the motherboard from the housing/chassis also requires that many of the peripheral components must be removed. The removal of the peripheral components means removal of cables and cable harnesses and the removal of printed circuit boards from busses or card-edge connectors.

Physical access to the motherboard is not uncommon. Since the motherboard is the main logic component of the logic module, many changes, upgrades, or repairs require physical access to the motherboard. Thus, to make changes, upgrades, or repairs to the motherboard necessitates disassembly of a major portion of the hardware of the logic module, including disconnection of peripheral components (monitors, drives, co-processors, additional memory, etc.), as well as the disassembly of the chassis from the motherboard before the motherboard can be accessed. For example, to upgrade a logic module by the addition of additional memory chips is usually a complex task that requires stripping of the logic module to access the site on the motherboard for adding expansion chips. To disassemble and reassemble a logic module correctly, without damaging anything, is a difficult task that often must be left to trained hardware service persons, making the versatility of an upgradable logic module very user unfriendly.

Access to the motherboard of traditional logic modules also requires a considerable time investment. It takes a considerable amount of time to disassemble the housing, remove the I/O panel, disconnect peripheral components, make the necessary change or upgrade and reassemble the module correctly. Time is an important commodity, particularly when the logic module is a server that serves many individual workstations or a controller that operates an industrial machine or process. Traditional logic modules do not offer any capability of reducing the amount of system downtime to repair, service, or upgrade the logic module. If a problem arises on the motherboard, a considerable time investment will be required to repair or replace the module. It may take several hours or days to restore the system to full operation capacity.

There exists a need for a logic module that provides easy and quick access to the module's hardware, particularly its main logic component. There exists a need for a logic module that reduces the amount of stripping of hardware components to gain access to the main logic component thereby reducing the chance for mistake or error. Finally, there exists a need for a logic module that minimizes the amount of system downtime for repairs, service, or upgrades.

SUMMARY AND OBJECTS OF THE INVENTION

The invention relates to a logic module comprising a panel slidably and detachably coupled to a portion of a module housing, and a logic component inside the housing and detachably coupled to the panel, wherein the logic component is capable of receiving, processing, and presenting information. Preferably, the panel is an Input/Output ("I/O") panel that is slidably and detachably coupled to the back portion of the module housing. The invention contemplates that the entire logic module (i.e., I/O panel and logic component) can be quickly and easily removed from the module housing without disconnecting cables, connectors, or cards. The invention contemplates that the logic components of the logic module are quickly and easily accessible for repair, replacement, or upgrading. The invention provides simple, direct access to the logic components without the struggle to remove cables, cards, screws, or housings.

The invention contemplates that a logic module with a motherboard and other logic components is easily accessed because the components are detachably attached to an I/O panel that is slidably removable from the module housing. In other words, the entire logic module can be accessed by sliding the I/O panel away from the module housing. Since the logic components are detachably coupled to the I/O panel, the logic components of the logic module are removed from the module housing by slidably removing the I/O panel. The invention contemplates that there are no screws or housing to be removed to access the logic module. Further, the invention contemplates that there are no cables to unplug or components to remove to remove the entirety of the logic module from the module housing.

A big advantage of this design is that all the important and sensitive electrical connections between logic components remain intact when the logic module is removed from the housing. This assembly allows in situ troubleshooting when the module is on the laboratory bench. Having to dismantle the module any further to get the module to the lab bench, or having to test components individually, would introduce variables into the testing that could obfuscate the true source of possible malfunctions.

The invention also relates to a logic module wherein the electronic signals between a motherboard and the module housing are consolidated at a single location. For example, the invention relates to a logic module wherein electronic communication between the motherboard and the module housing are consolidated at a mezzanine printed circuit board and wherein the motherboard is detachably coupled to and in electronic communication with the mezzanine printed circuit board. By consolidating the electronic communication between the motherboard and the logic module at a single mezzanine printed circuit board, the invention eliminates the individual cables and connections extending from peripheral components like drives and monitors. The consolidation of the electronic signals between the motherboard and the module housing facilitates the removal of the logic components from the logic module because it removes the individual cables and connections to separate sites on the motherboard that would otherwise require individual disconnection to remove the motherboard from the module housing. The invention contemplates that the single electronic connection of the logic components to the module housing is through a mezzanine printed circuit board, making removal of the logic module quick and easy.

The invention contemplates that the mezzanine printed circuit board is pivotally or floatably coupled inside the module housing to the front of the module housing. The advantage of the floating design of the mezzanine printed circuit board is that the user need not align and insert connectors by hand prior to the insertion of the logic module and then close the rear panel. Instead, connection of the logic module to the mezzanine printed circuit board and the closing and sealing of the unit can be accomplished in one motion. Further, the mating of the motherboard to the mezzanine printed circuit can be accomplished without visual assistance; the motherboard and the floating mezzanine printed circuit board align themselves, providing a "blind-mate" connection.

The invention further relates to a logic module wherein the electrical power to the logic components of the logic module is consolidated at a single location. For example, the invention relates to a logic module wherein electrical communication between the motherboard and the power supply are consolidated at a power connector and wherein the motherboard is detachably coupled to and in electrical communication with the motherboard. By consolidating the electrical communication between the motherboard and the power supply at a single power connector, the invention eliminates the individual wires and connections transferring electrical power throughout the logic module. The consolidation of the electrical signals between the motherboard and the power supply facilitates the removal of the logic module from the module housing because it removes the individual wires and connections to separate sites on the motherboard that would otherwise have to be individually disconnected to remove the motherboard from the module housing. The invention contemplates that the single electrical connection of the logic module is through a power connector, making removal of the logic module quick and easy.

The invention contemplates that the power connector is pivotally or floatably coupled inside the module housing to the front of the module housing. The advantage of the floating power connector is that the user need not align and insert connectors by hand and then insert the logic module and then close the rear panel. Instead, connection of the logic module to the power connector and closing and sealing the unit can be accomplished in one motion. Further, the mating of the motherboard to the power connector can be accomplished without visual assistance; the motherboard and the power connector align themselves, providing a blind-mate connection.

To accomplish the consolidation of the electrical signals at a single location also requires a novel power supply adapter. The novel power supply adapter is the subject of a pending patent application filed Dec. 22, 1995, and titled "Modular, Redundant, Hot Swappable, Blind Mate Power Supply System" by Robert N. Olson and William H. Bull and owned by Apple Computers, Inc. The contents of both these patent application are incorporated herewith.

The incorporation of consolidated systems into the logic module allows the logic components to be connected to or disconnected from the logic module housing by connecting or disconnecting the only two connections between them, the connection at the mezzanine printed circuit board and the connection at the power connection.

BRIEF DESCRIPTION OF THE DRAWINGS

The invention is illustrated by way of example and not limitation in the figures of the accompanying drawings, in which like references indicate similar elements and in which.

DETAILED DESCRIPTION

Figure 1:
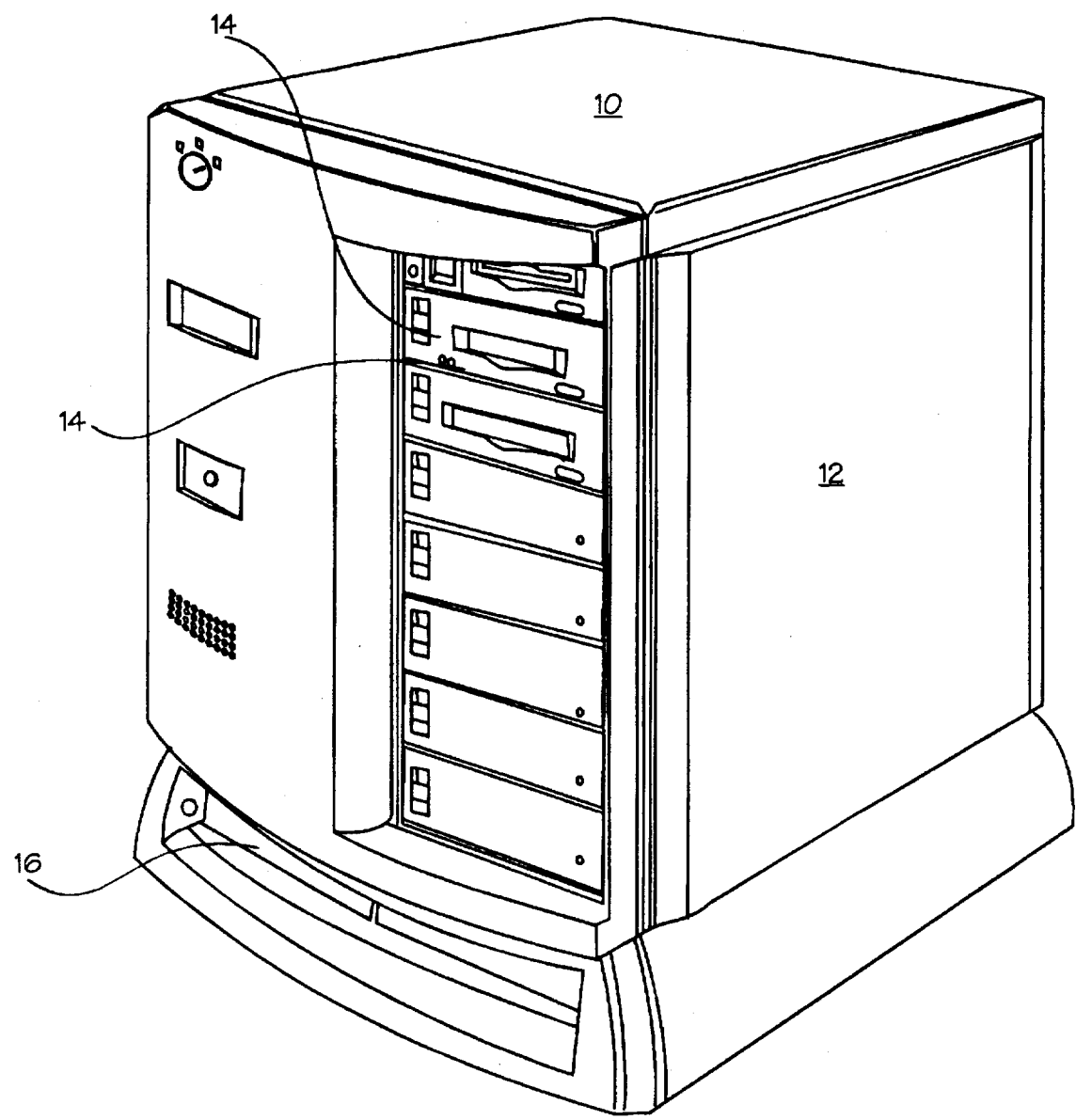
FIG. 1 is a front perspective view of a server containing a logic module and having a plurality of data drives and a power supply attached to the module housing.

The invention relates to a logic module comprising a panel slidably and detachably coupled to a module housing, and a logic component inside the module housing and detachably coupled to the panel. The invention contemplates that the logic module can be quickly and easily removed from the housing by slidably removing the panel. Thus, by slidably removing the panel from the housing, the logic module inside the housing is exposed so that it may quickly and easily be repaired, replaced or upgraded.

In a particular embodiment, the invention relates to a logic module that includes an I/O panel attached to the rear of the module housing, and a logic component that contains a motherboard that operates as the primary logic component of the logic module. The motherboard is detachably coupled to a board carrier wherein the board carrier is coupled to the I/O panel such that removal of the I/O panel from the module housing includes the removal of the board carrier and the motherboard. Other logic components can be connected to the motherboard and operated by the motherboard. Simple examples of components linked to the motherboard include memory chips, data drives, and monitors or other peripheral components. In general, components like data drives and monitors are electronically linked to the motherboard through cables. The instant invention contemplates that the electronic signals between the module housing and the motherboard are consolidated at a single mezzanine printed circuit board. The consolidation of the communication of electronic signals at a mezzanine board electronically linked to the motherboard obviates the need for cumbersome cable connections. Further, the consolidation of electronic signals further facilitates the removal of the logic component from the logic module because the removal of the logic component does not necessitate a preliminary removal of cables and connections. All that is required to disconnect the logic module from the module housing is the disconnection of one connector.

The invention contemplates that the mezzanine printed circuit board is pivotally or floatably coupled inside the module housing to the front of the module housing. The advantage of the floating mezzanine printed circuit board is that the user need not align and insert connectors by hand and then insert the logic module and then close the rear panel. Instead, connection of the logic module to the mezzanine printed circuit board and the closing and sealing of the unit can be accomplished in one motion. Further, the mating of the motherboard to the mezzanine printed circuit can be accomplished without visual assistance; the motherboard and the floating mezzanine printed circuit board align themselves, providing a blind-mate connection.

The invention also contemplates the consolidation of electrical signals between the logic module and the power supply through a single power connector. Like the mezzanine printed circuit board, all electrical connections between the power supply and the logic module emanate through a power connector electrically linked between the power supply and the logic component. The consolidation of the electrical signals between the logic module and the power supply facilitate the removal of the logic component from the logic module, because it translates into a single power connection that must be disengaged from the logic module rather than struggling with a power cable or a number of power cables.

The invention contemplates that the power connector is pivotally or floatably coupled inside the module housing to the front of the module housing. The advantage of the floating power connector is that the user need not align and insert connectors by hand and then insert the logic module and then close the rear panel. Instead, connection of the logic module to the power connector and closing and sealing the unit can be accomplished in one motion. Further, the mating of the motherboard to the power connector can be accomplished without visual assistance; the motherboard and the power connector align themselves, providing a blind-mate connection.

FIG. 1 illustrates a front perspective view of a housing that contains a logic module. The apparatus shown in FIG. 1 is a server. The server 10 contains a plurality of data drives 14 attached to the module housing 12. Information can be supplied to the logic module of the server 10 through the plurality of data drives 14 attached to the module housing 12. At the base of the server 10 is a power supply or power supplies 16 further attached to the module housing 12.

Figure 2:
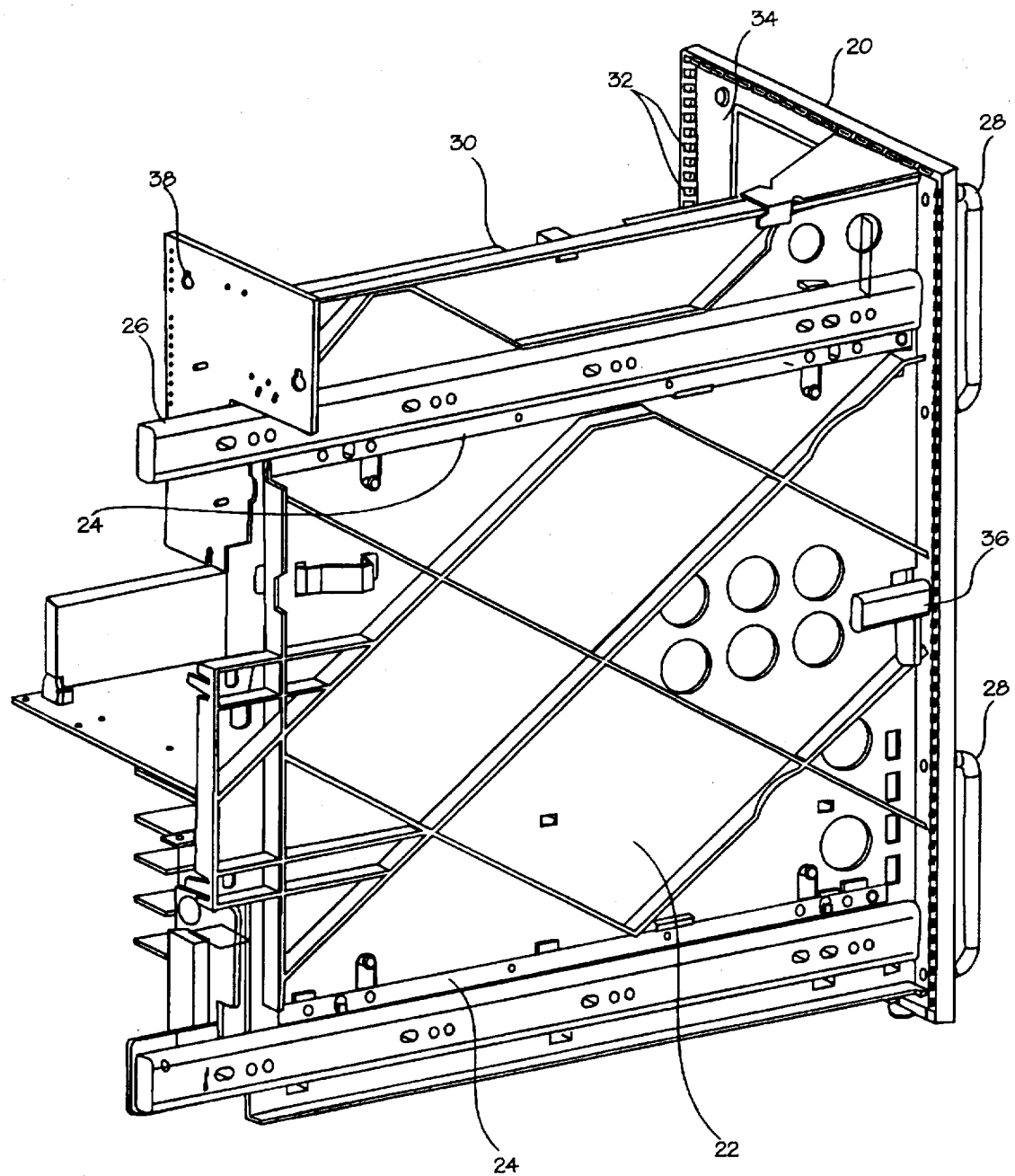
FIG. 2 is a side perspective view of a logic module for use in a server presenting a logic component detachably coupled to a board carrier, the latter coupled to an I/O panel.

FIG. 2 presents a side perspective view of a portion of a logic module for use in a server. FIG. 2 shows a sheet metal I/O panel 20 coupled to a board carrier 22. The board carrier 22 holds the logic component (not shown) and together the board carrier 22 and the logic component fit within the module housing. FIG. 2 also shows a pair of ball bearing drawer slides 26 attached to a pair of mounting rails 24, the mounting rails in turn attached to the board carrier 22. The invention contemplates that the drawer slides are engaged to the side of the module housing (not shown). The logic components of the logic module can be accessed by sliding the mounting rails 24 along the drawer slides 26 attached to the inside of the module housing. A pair of handles 28 are attached to the I/O panel to facilitate the sliding of the logic component 30 away or toward the module housing. According to this embodiment, the entire logic component assembly 30 can be slid out the rear of the module housing, exposing the entire logic component assembly 30, including a motherboard and auxiliary printed circuit boards, while still being attached to and supported by the drawer slides 26. Alternatively, the mounting rails 24 can be disconnected from the drawer slides 26 by lifting two caches, and the entire logic module (I/O panel 20 and logic component 30) can be removed from the module housing for repair, replacement, or upgrading. When the logic component 30 is seated on the drawer slides 26, the logic component 30 can be slid into place inside the housing.

A big advantage of this design is that all the important and sensitive electrical connections between logic components remain intact when the logic module is removed from the housing, thus allowing in situ troubleshooting when the logic module is on the laboratory bench. Having to dismantle the logic module any further, or having to test components individually, would introduce variables into the testing that could disguise the true source of possible malfunctions.

FIG. 2 illustrates slide mounting rails and ball bearing drawer slides as the sliding means for removing or inserting the logic module (the I/O panel 20 and the logic component 30). A person of ordinary skill in the art will recognize that the particular illustration of mounting rails and drawer slides is merely illustrative of the many types of sliding means available to accomplish the invention. The application is not meant to be limited to the particular mounting rails/drawer slides depicted, but contemplates embodiments using any known form of sliding means for removing the logic module as well as any known form of detaching means for detaching the mounting rails from the drawer slides.

The invention complies with Federal Communications Commission ("FCC") rules against harmful interference when the equipment is operated. The invention complies with FCC rules by being sealed when the I/O panel 20 is detachably and slidably coupled in the closed position to the module housing. In the preferred embodiment, the inside of the I/O panel 20 is surrounded by sheet metal contact fingers 32 that spring back when forced against the module housing. The contact fingers 32 extend from a sheet metal shroud 34 that is coupled to the inside of the I/O panel 20, the sheet metal shroud 34 serving as a ground particularly for errant electrical charges that might be inadvertently transmitted to the module from an external source.

FIG. 2 also shows a key lock mechanism 36 that serves to lock the I/O panel in place against the housing. The key lock mechanism 36 prevents against tampering and, in the preferred embodiment, signals the logic module that the system is complete and may be operated.

FIG. 2 also presents a mezzanine printed circuit board 38. FIG. 2 presents the back side of the mezzanine printed circuit board 38 wherein the mezzanine printed circuit board 38 is attached to a motherboard (not shown). The back side of the mezzanine printed circuit board 38 is pivotally or floatably coupled inside the housing to the front portion of the module housing. Since the module housing is not shown in FIG. 2, the back side of the mezzanine printed circuit board 38 is shown not attached to anything.

The mezzanine printed circuit board 38 is utilized to consolidate electronic signals between the motherboard and the module housing. The mezzanine printed circuit board 38 is in electronic communication with both the motherboard and the module housing. For example, electronic signals from data drives (e.g., disk, CD-ROM, DAT drives) attached to the module housing are transmitted through the mezzanine printed circuit board 38 and transmitted to the motherboard. The mezzanine printed circuit board 38 eliminates the need for cables running from each drive to a location on the motherboard. To establish electronic communication between the logic component 30 and the mezzanine printed circuit board 38, the logic component 30 is simply connected to the mezzanine printed circuit board 38 (e.g., through a card-edge connector).

The invention contemplates that the mezzanine printed circuit board 38 is pivotally or floatably coupled inside the module housing to the front of the module housing. By floating or pivoting is meant that the mezzanine printed circuit board 38 can pivot, move, or float about its coupling to accommodate the mating location of the motherboard when logic module is inserted into the module housing. The advantage of the floating mezzanine printed circuit board is that the user need not align and insert connectors by hand and then insert the logic module and then close the rear panel. Instead, connection of the logic module to the mezzanine printed circuit board and the closing and sealing of the unit can be accomplished in one motion. Further, the mating of the motherboard to the mezzanine printed circuit can be accomplished without visual assistance; the motherboard and the floating mezzanine printed circuit board 38 align themselves, providing a blind-mate connection.

Figure 3:
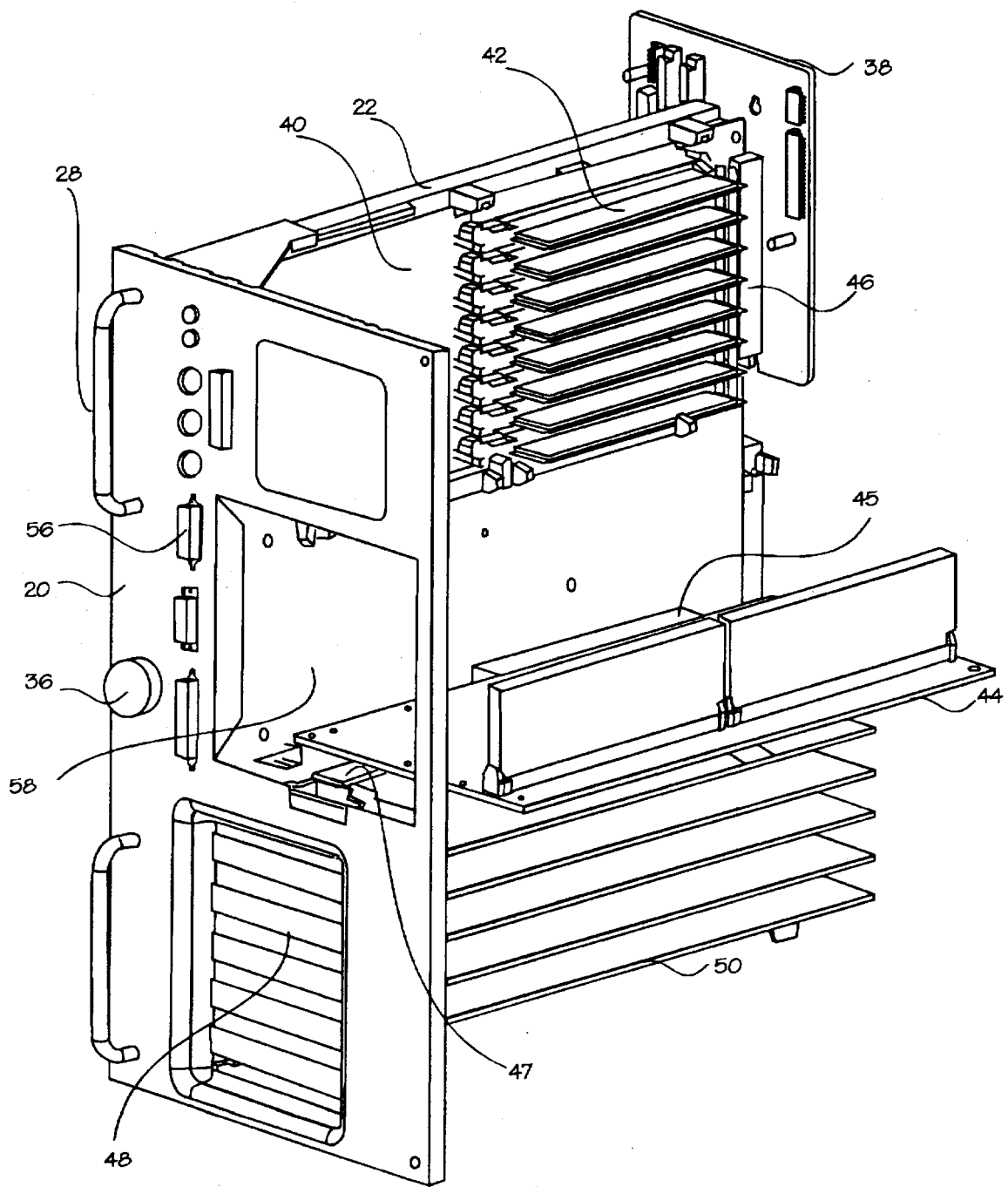
FIG. 3 is a side perspective view of a logic module for use in a server presenting a logic component detachably coupled to a board carrier, the latter coupled to an I/O panel.

FIG. 3 presents another side perspective view of a logic module for use in a server, specifically presenting a logic component detachably coupled to an I/O panel 20. FIG. 3 shows an I/O panel 20 coupled to a board carrier 22. The logic component is attached to the board carrier 22. In this depiction of a server, the logic component consists of a motherboard 40 detachably coupled to the board carrier 22 with several printed circuit boards 42 detachably coupled to the motherboard 40. The several printed circuit boards 42 correspond to components such as data drives attached to the front of the logic module housing. The printed circuit boards 42 are electronically linked to their corresponding components through a mezzanine printed circuit board 38. The mezzanine printed circuit board 38 is pivotally or floatably coupled inside the logic module housing to the front portion of the module housing. A card-edge connector 46 with guide ramps on the floating mezzanine printed circuit board 38 mates with a contact finger on the motherboard 40 to establish electronic communication between the motherboard 40 and the mezzanine printed circuit board 38. The motherboard 40, attached to the board carrier 22, slides along the drawer slides into the card-edge connector 46. The mezzanine printed circuit board 38 floats or pivots laterally about its coupling to accommodate any shifting in the motherboard 40 and assures that the motherboard 40 makes proper contact. The mezzanine printed circuit board 38 is firmly connected to the module housing to assure proper contact with the motherboard 40. The guide ramps on the card-edge connector 46 further serve to guide the contact finger of the motherboard 40 into proper alignment and contact with the mezzanine printed circuit board 38. The mezzanine printed circuit board 38 eliminates the use of cables to extend from the components attached to the front of the module housing to locations on the motherboard. The disconnection or connection of all the electronic connections between the motherboard 40 and the module housing is accomplished at the mezzanine printed circuit board connector 46. Further, the floating coupling of the mezzanine printed circuit board 38 to the housing eliminates visual alignment of the motherboard to the connector 46 of the mezzanine printed circuit board 38. This design creates contacts that align themselves, or blind-mating.

FIG. 3 also presents an additional processor printed circuit board 44 attached to the motherboard 40. The additional processor printed circuit board 44 is coupled to the motherboard 40 through a card-edge connector or bus 45. In this embodiment, the additional processor printed circuit board 44 is provided with supplemental support brackets 47. In addition to the additional processor printed circuit board 44, FIG. 3 shows several auxiliary printed circuit boards 50 attached to the motherboard 40 and corresponding to expansion slots 48 in the I/O panel 20. Examples that correspond to these auxiliary printed circuit boards, include, but are not limited to, networking cards and storage device controllers. These auxiliary printed circuit boards 50 may or may not be supported by supplemental support brackets.

The I/O panel 20 in FIG. 3 includes handles 28, a keylock mechanism 36, expansion slots 48, and several connectors 56 to link external components to the logic module. Examples of external components that attach to servers, include, but are not limited to, monitors, printers, keyboards, and mice.

Figure 4:
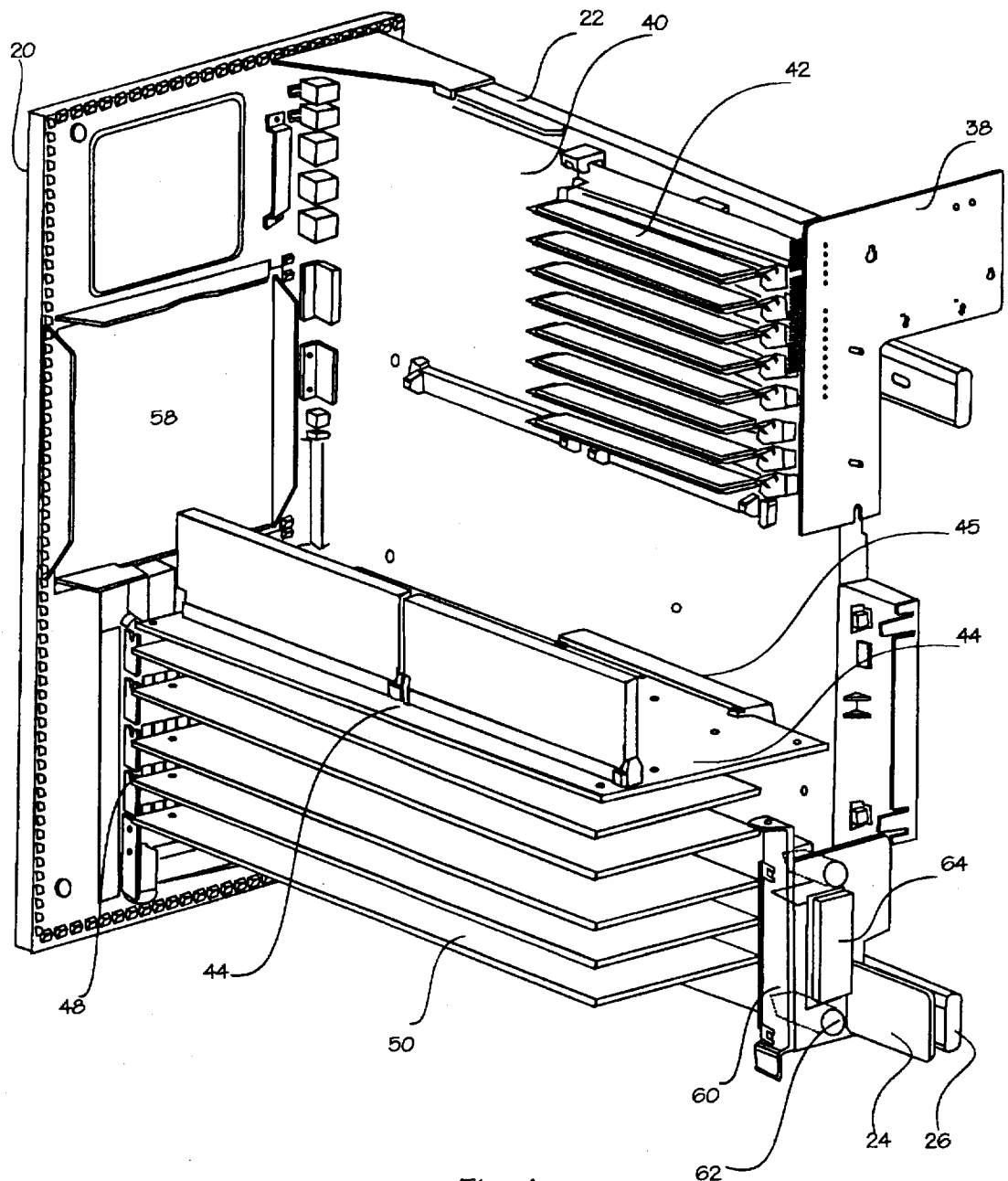
FIG. 4 is a side perspective view of a logic module for use in a server presenting a logic component detachably coupled to a board carrier, the latter coupled to an I/O panel.

FIG. 4 presents another side view of a logic module for use in an server specifically presenting a logic component detachably coupled to an I/O panel 20. FIG. 4 shows an I/O panel 20 attached to a board carrier 22. A logic component that is a motherboard 40 is detachably coupled to the board carrier 22. Additional printed circuit boards 42 are attached to the motherboard 40 and linked to corresponding components (e.g., data drives) attached to the front of the module housing (not shown) through a pivoting or floating mezzanine printed circuit board 38. FIG. 4 also shows a processor printed circuit board 44 attached to the motherboard 40 and several auxiliary printed circuit boards 50 attached to the motherboard 40 and corresponding to expansion slots 48 in the I/O panel 20.

FIG. 4 further shows the drawer slides 26 that are attached to the inside of a side wall of the module housing (not shown). A pair of corresponding mounting rails 24 are attached to the board carrier 22 and the I/O panel 20 and permit the logic module (i.e., the I/O panel 20, the board carrier 22, and the logic components, including the motherboard 40, component printed circuit boards 42, additional processor 44, and auxiliary printed circuit boards 50) to slide into and out of the module housing.

FIG. 4 further presents a power connector 64 in electrical communication with a power supply (not shown) and in electrical communication with the motherboard 40. The power connector 64 is loosely, floatably, or pivotally coupled to a power cable bracket 60, wherein the power cable bracket 60 is coupled inside the module housing to the front portion of the housing. Since the housing is not presented in FIG. 4, the power cable bracket 60 is shown unconnected. Attached to the power cable bracket 60 are a pair of cantilever guide pins 62. The power connector 64 mates with a corresponding connector on the motherboard 40 (not shown). The power connector 64 floats in its coupling to the power cable bracket 60 to accommodate any shifting in the motherboard 40 as the motherboard 40 and other logic components slide into the module housing and to assure that the connector in the motherboard 40 and the power connector 64 make proper contact. The pair of cantilever guide pins 62 serve to further assure proper alignment. The power cable bracket 60 is firmly connected to the module housing to assure proper contact with the motherboard 40. The floating coupling of the power connector 64 to the power cable bracket 60 eliminates visual alignment of the motherboard 40 to the power connector 64. This design creates blind-mating, or contacts that align themselves.

The use of the power connector 64 consolidates the electrical power input to the logic components at a single location on the motherboard 40 to eliminate cables running between a power supply and system components. By eliminating otherwise necessary cables, the I/O panel 20 and the logic components may be easily removed from the rear of the module housing by the disconnection of a single electrical power connection at the power connector 64.

In the preceding detailed description, the invention is described with reference to specific exemplary embodiments thereof. It will, however, be evident that various modifications and changes may be made thereto without departing from the broader spirit and scope of the invention as set forth in the claims. For example, the above embodiment describes a server, but the invention is not limited to servers. It is evident that the invention will work in any logic module, including stand-alone computers and controllers. The specification and drawings are, accordingly, to be regarded in an illustrative rather than a restrictive sense.

What is claimed is:

1. A logic apparatus comprising:
    a module housing having a front portion and opposing side walls, said front portion including at least one housing component capable of at least one of presenting and receiving an electronic signal;
    a logic module including a panel and a logic component detachably coupled to said panel, said logic component capable of presenting, receiving, and processing an electronic signal; and
    a mezzanine printed circuit board coupled to said front portion of said module housing,
    wherein said logic module is detachably coupled to said module housing by said detachable coupling of said logic component to said mezzanine printed circuit board, such that said mezzanine printed circuit board is in electronic communication with said logic component to consolidate communication of electronic signals between said logic component and said at least one housing component.

2. The logic apparatus of claim 1, wherein said mezzanine printed circuit board is pivotally or floatably coupled to said module housing.

3. The logic apparatus of claim 1, wherein said logic component of said logic module includes a printed circuit board that is a motherboard.

4. The logic apparatus of claim 3, wherein said logic component includes a motherboard that is capable of accommodating an auxiliary processor and an auxiliary or an expansion printed circuit board.

5. The logic module of claim 1, wherein said panel of said logic module is an Input/Output panel.

6. The logic apparatus of claim 4, wherein said panel of said logic module is an Input/Output panel and wherein said Input/Output panel includes an expansion slot for external connection to an auxiliary printed circuit board.

7. The logic apparatus of claim 1, wherein said logic module is slidably coupled to said module housing.

8. The logic apparatus of claim 7, wherein said logic component of said logic module includes a board carrier such that said logic component is detachably coupled to said board carrier and said board carrier is coupled to said panel of said logic module.

9. The logic apparatus of claim 8, wherein said module housing further comprises a drawer slide coupled to the inside of a side wall of said module housing and said logic module further comprises a mounting rail coupled to said board carrier of said logic module, wherein said mounting rail is slidably coupled to said drawer slide.

10. The logic apparatus of claim 1, wherein said logic component of said logic module is detachably coupled to said mezzanine printed circuit board by the union of a card-edge connector on one of said mezzanine printed circuit board and said motherboard and a contact finger on the other of said mezzanine printed circuit board and said motherboard.

11. The logic apparatus of claim 10, wherein said card-edge connector includes guide ramps to guide said contact finger into said card-edge connector.

12. logic module of claim 1, wherein said logic module is detachably coupled to a power supply.

13. The logic module of claim 12, wherein said logic component is detachably coupled to said power supply through a power connector, wherein said power connector is pivotally or floatably coupled to a power cable bracket, wherein said power cable bracket is coupled inside said module housing to the front portion of said module housing and wherein said power cable bracket includes a pair of cantilever guide pins to accommodate the mating of said power connector and said logic component when said logic component is in a first position.

14. A computer apparatus comprising:
    a module housing having a front portion and opposing side walls, said front portion including a plurality of housing components, each housing component capable of at least one of presenting and receiving an electronic signal;
    a logic module including a logic component that includes a printed circuit board that is a motherboard, said logic component capable of presenting, receiving, and processing an electronic signal; and
    a mezzanine printed circuit board coupled to said front portion of said module housing, wherein said motherboard of said logic module is detachably coupled to said housing components by said detachable coupling of said motherboard to said mezzanine printed circuit board, such that said mezzanine printed circuit board is in electronic communication with said motherboard to consolidate communication of electronic signals between the motherboard and said housing components.

15. The computer apparatus of claim 14, wherein said logic module further includes an Input/Output panel and wherein said motherboard is detachably coupled to said Input/Output panel.

* * * * *